Figure 1:
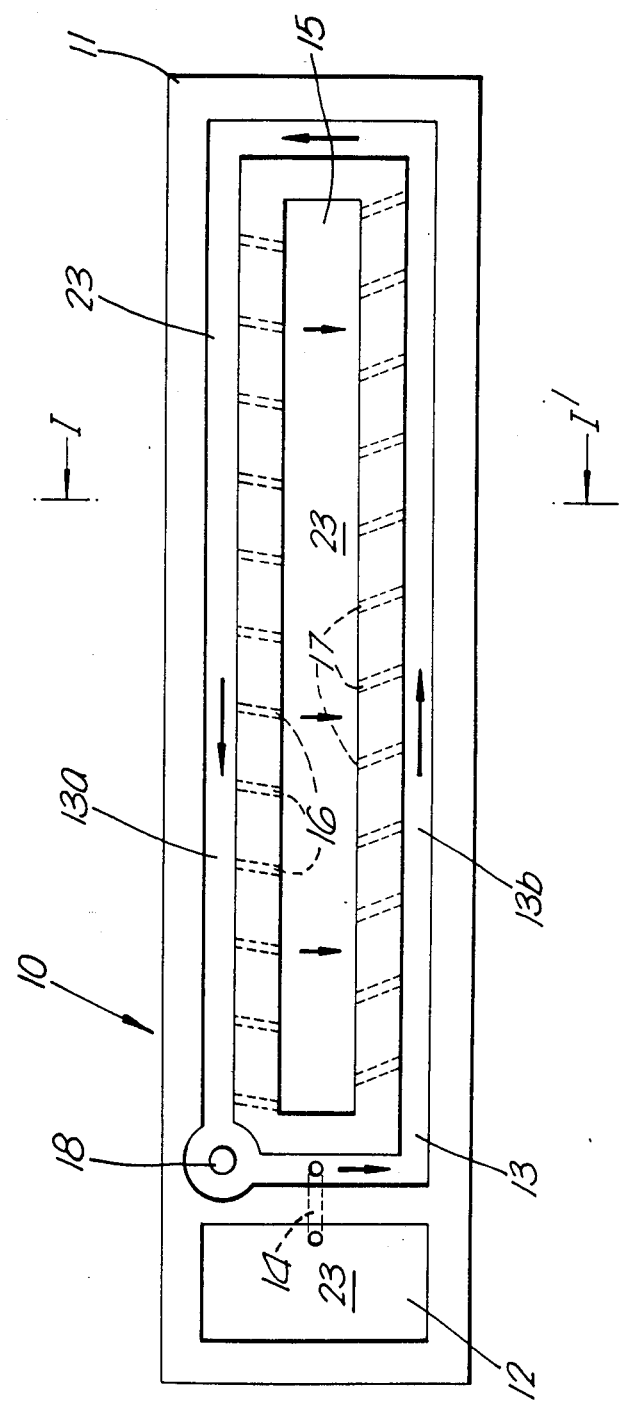

United States Patent [19]

Gardiner et al.

[11] Patent Number: 4,707,333

[45] Date of Patent: Nov. 17, 1987

[54] ALLOY PRODUCTION BY VAPOR CONDENSATION

[75] Inventors: Robert W. Gardiner, Farnham; Brian W. Viney, Farnborough; Garyth Hughes, Farnham, all of England

[73] Assignee: The Secretary of State for Defence in Her Brittanic Majesty's Government of the United Kingdom of Great Britain and Northern Ireland, London, England

[21] Appl. No.: 803,591

[22] Filed: Dec. 2, 1985

[30] Foreign Application Priority Data

Dec. 4, 1984 [GB] United Kingdom ................ 8430509

[51] Int. Cl.⁴ ............................................. C22C 1/00
[52] U.S. Cl. ................................... 420/590; 266/200; 266/210; 266/233
[58] Field of Search ....................... 118/762; 420/590; 266/200, 216, 208–211, 233; 427/248.1, 250

[56] References Cited

U.S. PATENT DOCUMENTS 3,935,003  1/1976  Steinke ............................... 75/68 R

FOREIGN PATENT DOCUMENTS 1206586  9/1970  United Kingdom .
1265965  3/1972  United Kingdom .
1440921  6/1976  United Kingdom .

Primary Examiner—Christopher W. Brody
Attorney, Agent, or Firm—Cushman, Darby & Cushman

[57] ABSTRACT

In the production of alloy by evaporation from an evaporation bath and condensation under vacuum, charge replenishment is achieved by a procedure involving bleeding charge from the bath and admixing the bled charge with replenishment material and introducing replenishment from the admixture. An apparatus for use in the process comprises a mixing passageway encompassing an evaporation bath and distributed sub-surface bleed ports and feed ports linking the evaporation bath and the mixing chamber. Flow of metal through the ports is induced by pumped circulation in the mixing chamber. The circulation is turbulent for good mixing of the metals.

14 Claims, 2 Drawing Figures

ALLOY PRODUCTION BY VAPOR CONDENSATION

The present invention relates to the production of alloys by condensation under vacuum from the vapour phase, and to apparatus for such production.

It is known that alloys may be produced by co-evaporation of constitutent metals from an evaporation bath for condensation upon a collector providing that the vapour pressures of the constituent metals are not too disparate. The fundamental features of such a production process have been described in publications such as UK patent Nos. 1206586 and 1265965. Even though the vapour pressures of the alloy constituents will not be disparate, in alloys suitable for production by this route, it is necessary to take account of the differences in vapour pressure in order to produce an alloy to the required composition. The evaporation bath charge must contain proportionately more of the less volatile metals than does the required product alloy. Once a steady state has been established, the evaporation bath is replenished with ingredients in proportion to the composition of the product alloy for the loss from the evaporation bath corresponds to the product alloy.

Replenishment of the evaporation bath charge must be carried out in a careful way in order to avoid non-uniformities in the product alloy. These non-uniformities can be caused by local or general changes in the temperature and/or composition of the evaporation bath charge. Temperature variations affect the relative volatilities of the alloy ingredients. Compositional variations affect the relative abundance of the charge ingredients and in consequence the relative abundance also in the vapour flux.

One technique for replenishing the evaporation bath charge is that disclosed in the Applicant's UK patent No. 1440921 wherein replenishment metal is passed through a constriction between a melting chamber and a mixing chamber and thereafter passed into the evaporation bath through a sub-surface passage. This technique is intended to produce intermixing of the replenishment metals before introduction to the charge in the evaporation bath. Another technique that the Applicant has previously utilised includes a distribution passage lying alongside an evaporation bath, and in this technique the replenishment material is passed from the distribution channel to the evaporation bath through spaced sub surface passages. Both these previous systems have created some difficulties in their use. The replenishment metal must be kept at a temperature sufficiently low to avoid significant evaporation thereof and for this reason there is a significant difference between the temperature of the evaporation bath charge and that of the replenishment material. There is also a difference in composition between the charge and the replenishment material which effects the relative densities. These factors have tended to cause the replenishment material to be poorly mixed with the charge and they can lead to the creation of cooler areas with incorrect ingredient proportions, of the charge surface.

It is an object of the present invention to improve the uniformity of deposited alloy produced from the vapour phase and to increase the degree of control over such a production process, by improving the method and means by which the evaporation bath charge is replenished.

Accordingly, one aspect of the present invention is a method for the replenishment of charge material within an evaporation bath, in a process for the production of alloy by evaporation of molten alloy from the evaporation bath and condensation of the vapour upon a temperature-controlled collector all under vacuum conditions, wherein the method comprises the following:

i. melting and outgassing replenishment metals;

ii. circulating the molten and outgassed metal in a turbulent manner within a mixing chamber;

iii. bleeding a portion of the evaporation bath charge through a plurality of spaced-apart sub-surface passageways and introducing the bled charge material into the mixing chamber wherein it is caused to be mixed with the replenishment metals by the turbulence of the latter's circulations;

iv. feeding into the evaporation bath through a plurality of spaced-apart sub-surface passageways, a sufficient portion of the thus produced mixture of bled charge and replenishment metals to maintain the evaporation bath charge.

Preferably the bleeding of evaporation bath charge is caused by the circulation within the mixing chamber and preferably the feeding of metals into the evaporation bath as replenishment charge is caused by this circulation also. The temperature of the liquid metals in the mixing chamber may be controlled so as to minimise evaporation therefrom and so as to maintain a substantially constant temperature difference between these metals and the charge in the evaporation bath.

Preferably the rate at which metal is bled from the charge and the rate at which metal is fed to the charge is large in comparison to the rate of loss of charge through evaporation. At present it is preferred that the bleed rate be at least 10 times, (especially 10–20 times) the evaporation rate. The feed rate is of course equal to the sum of the bleed rate and evaporation rate. By this means an active flow of metals in the evaporation bath is created between bleed ports and feed ports to ensure improved mixing of charge and replenishiment.

Preferably the circulation flow in the mixing chamber is large in relation to the bleed rate in order to minimise temperature and compositional fluctuations caused by influx of bleed metal and exflux of feed metal. Preferably the circulation flow is 70–130 times the evaporation rate.

A second aspect of the invention is an apparatus for performance of the method of the invention, which apparatus comprises:

i. an evaporation bath;

ii. a mixing chamber consisting of a passageway encompassing the evaporation bath;

iii. passageways linking the interior of the evaporation bath to the mixing chamber the passageways forming two groups each group comprising a plurality of such passageways issuing from the evaporation bath at spaced apart sub-surface locations therein;

iv. pump means operable to cause turbulent flow of liquid metal along the mixing chamber passageway;

v. bleed means operable to cause withdrawal of liquid metal from the evaporation bath through the passageways of one of the aforementioned groups; and vi. feed means operable to cause introduction of liquid metal to the evaporation bath through the passageways of the remaining group.

Preferably the bleed means comprises a divergent section of the mixing chamber passageway such that the withdrawal of liquid metal from the evaporation bath is produced by a decrease in hydrodynamic pressure consequent on the flow through the section.

Preferably the feed means comprises a convergent section of the mixing chamber passageway such that the introduction of liquid metal to the evaporation bath is caused by an increase in hydrodynamic pressure consequent on the flow through the section.

The pump means may comprise any pump of adequate capacity suitable for use with liquid metal at the appropriate temperature. It is considered that electromagnetic pumps are particularly suitable but care should be taken when utilising such pumps to avoid interference with the operation of any electron beam guns used for the evaporation process.

The apparatus may include a feed stock melting chamber means to melt metal therein and a sub-surface passageway linking the melting chamber to the mixing chamber. The flow of molten metal through the passageway is caused by gravity.

The feed stock melting section is used for the melting, homogenization and out-gassing of the feed alloy. This section may be heated by any convenient method, e.g. by induction, and the bath may be maintained at a temperature approximately 50° C. or more above the liquidus of the alloy. The volume of alloy in the feed stock melting section is preferably large, in order to ensure uniform composition. Feed to the bath can be either solid or liquid, for example, as elemental additions in the correct proportions, elemental and/or master alloy additions or pre-melted and cast alloy feedstock. The feedstock is added at a rate corresponding to the net evaporation rate, so that liquid levels in the system remain substantially constant.

The feed stock melting section is linked to the mixing chamber by a passageway beneath the liquid level of the former to avoid introducing dross to the mixing chamber.

In order to maintain a substantially constant level of molten metal within the evaporation bath, the net feed to the bath must match the net rate of exhaustion by evaporation. The liquid levels in the evaporation bath and the mixing chamber will maintain an overall balance under gravitational influence. Within these constraints the apparatus is arranged so that the volume of liquid metal in the evaporation bath is large compared to the net evaporation rate and is large also when compared with the rate of withdrawal by the bleed means. Accordingly the flow rate in the mixing chamber and the geometry of the convergent and divergent sections are so linked as to create a suitable efflux and influx. The rate of flow within the mixing chamber passageway should be sufficient to ensure turbulence in order to mix the bleed metal with the other metal in the chamber. The rate of flow in the mixing chamber should also be large in comparison with the bleed rate and the feed rate in order that the effect of incoming bleed metal and outgoing feed metal upon the temperature and composition of the metals in the mixing chamber is minimised. At present a mixing chamber flow rate of 70–130 times the rate of evaporation from the evaporation bath is preferred.

The bleed rate and feed rate will be linked to the flow rate in the mixing chamber and by the degree of change in cross section in the divergent and convergent sections. Ideally the convergent section should have a greater change in section than the divergent section because the feed rate is greter than the bleed rate by the level of evaporation rate. However, the difference is likely to be sufficiently small that it may be ignored so that the convergent and divergent sections may have identicial change in section. A change in section of some 7–30% is preferred.

Whilst the metal in the mixing chamber is maintained at a lower temperature than the metal in the evaporation bath in order to minimise evaporative loss therefrom, the passageways are preferably enclosed to contain all evaporant. It is preferred also that the evaporation bath be screened to constrain the vapour flux issuing from the evaporation bath and to direct liquid condensate to the mixing chamber for recirculation.

Figure 2:
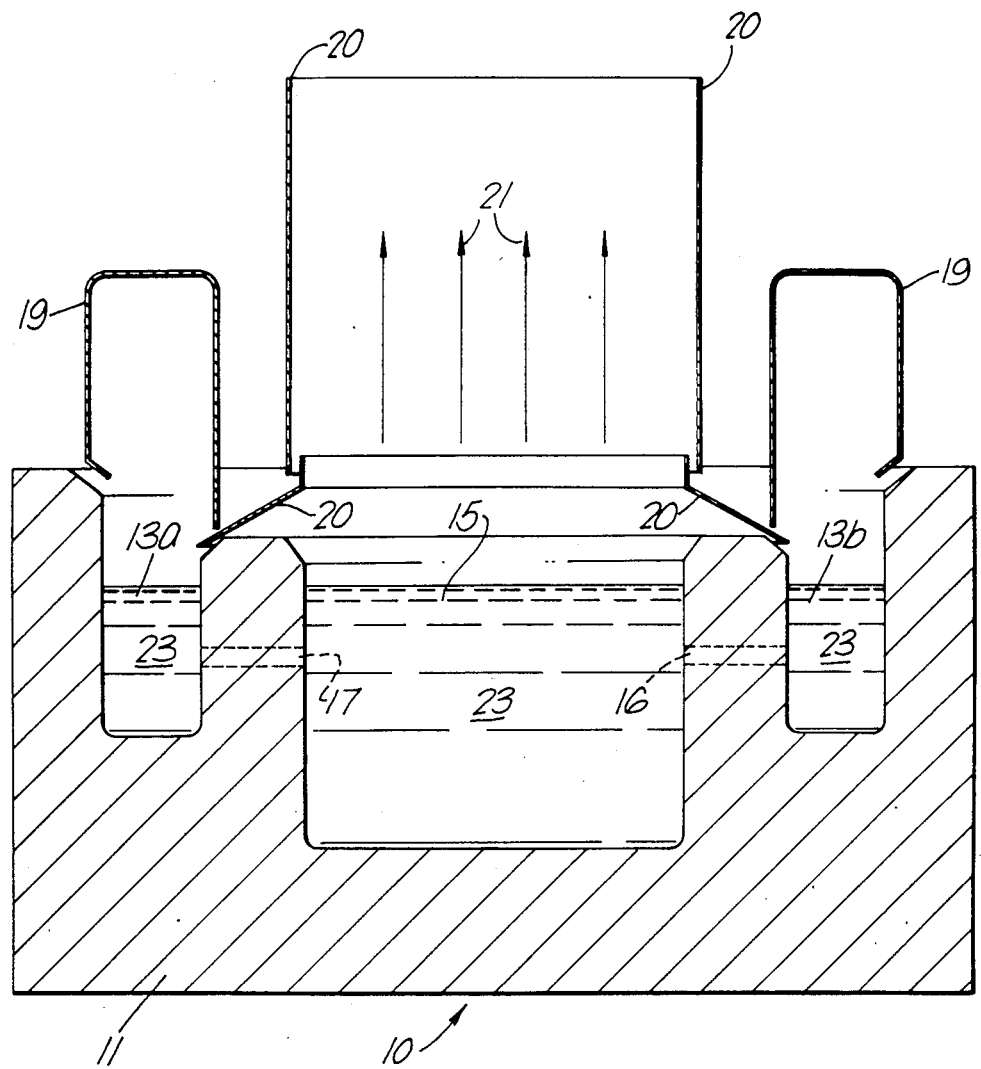

In order that the invention may be more fully understood one example will now be described with reference to the accompanying drawings, of which:

FIG. 1 shows a schematic plan view of an apparatus according to the invention (omitting vapour covers and screens), and FIG. 2 which shows an elevation in section through the plane denoted by I—I$^1$ together with vapour covers and screens.

The apparatus and process of the invention is described with reference to production of an aluminium alloy having the composition measured by weight percentage of Al-7.5Cr-1.2Fe.

Referring now to the figures in which corresponding features are denoted by common reference numerals.

The apparatus comprises a crucible system which is denoted generally at 10 and is mainly formed from a mouldable refractory material 11 such as an aluminosilicate. The crucible system 10 comprises a feed stock melting section 12, a mixing chamber 13 and a feed duct 14 which links the two. The mixing chamber 13 is a channel which encompasses an evaporation bath 15 and has sections 13A and 13B. Section 13A is linked to the evaporation bath 15 by feed ports 16 and section 13B is linked to the evaporation bath by bleed ports 17. Both bleed ports 16 and feed ports 17 issue at points beneath the liquid level of the evaporation bath 15.

In the mixing channel section 13 is an electromagnetic pump 18. Above the mixing chamber 13 is a combined top cover and side screen arragement 19 to direct undesirable evaporant back into the mixing chamber 13. To each side of the evaporation bath 15 are screens 20 to both direct the vapour flux 21 (denoted by arrows) towards a cylindrical rotatable collector 22 (not shown) and to condense stray evaporant and allow it to run back into the mixing channel 13. The various crucible sections 12, 13 and 15 contain aluminium alloy designated 23. The composition of the alloy is not the same in each section. Dimensions of the evaporation bath 15 are approximately 1100 mm long, 100 mm wide and 100 mm deep. Heating of the feed stock melting section 12 is by induction and heating of the evaporation bath 15 is by electron beam melting. The whole crucible system 10 and collector 22 is contained within a vacuum chamber in known manner.

The apparatus is operated in the following way. First a charge of alloy in the evaporation bath 15, having the composition by weight Al-18%Cr-23Fe is heated by an electron beam apparatus (not shown) to a temperature 1650° C. Then metal in the melting section 12 is melted to a temperature about 150° C. above the liquidus. This latter metal has the composition of the required product alloy which is Al-7.5Cr-1.2Fe. Liquid metal enters the mixing chamber 13 by gravity flow from the evaporation bath 15 and the melting section 12 and this is maintained at about 1400° C. by conduction of heat from evaporation bath 15. At 1400° C. the evaporation rate of the mixing chamber alloy is only about 10% of the evaporation rate of alloy at the evaporation bath working temperature of 1650° C. The mixing chamber 13 has covers 19 to condence any alloy evaporating therefrom. The evaporation bath 15 has an evaporation rate of about 50 kg/h at the temperature of operation and about 15 kg/h of this condenses on the screens 20 and is directed to the mixing chamber 15 together with condensate from the mixing chamber covers 19. The metal in the mixing chamber 15 is circulated around the chamber at a flow rate, substantially greater than the rate of loss from the evaporation chamber by evaporation. A flow rate of 3500 kg/h in an open channel such as that used for the mixing chamber ensures turbulence in the flow for good mixing of the constituents and ensures also that the composition remains constant around the chamber (to about 0.1%) despite the bleed from, and feed into, the evaporation bath 15.

Mixing chamber section 13A has a change in cross-section (of the liquid containing channel) over the convergence which corresponds to the required feed rate, and section 13A has a similar degree of divergence. It is intended that the mass flow rate within the evaporation bath, along the line arrowed in FIG. 1 be within the range of 10 to 20 times the evaporation rate of 50 kg/h. It is also arranged that the volume of the evaporation bath is large in relation to the bleed and feed rate to minimise compositional and temperature variations and to minimise any turbulence at the evaporation bath suface. Within a given change in mixing chamber cross section the bleed or feed rate is dependent on the mixing chamber flow. A change in cross section of 15% over sections 13A and 13B coupled with a mixing chamber flow of 3500 kg/h should provide a bleed and feed rate within the desired range.

It will be appreciated that the required convergence and divergence of the mixing chamber 13 in the respective sections 13A and 13B may be achieved by inclination of any liquid containing wall with respect to the centre line of the channel. A non-linear taper could be used to correct any lack of symmetry in the metal flows but it is not thought to be necessary. The bleed ports 17 and feed ports 16 are shown as being oblique to the flow through the mixing chamber 15 as an aid to creation of the desired flow therein. This is considered useful but not essential. The apparatus may be linked with means (not shown) for manual or automatic introduction of solid metal to the melting section 12.

We claim:

1. A method for the replenishment of charge material within an evaporation bath, in a process for the production of alloy by evaporation of molten alloy from the evaporation bath and condensation of the vapor upon a temperature controlled collector all under vacuum conditions wherein said method comprises the following preliminary steps:

providing a charge of molten degassed metal in an evaporation bath;

melting and outgassing feedstock metal in a feedstock melting chamber;

passing molten metal from the evaporation bath and from the feedstock melting chamber to a mixing chamber;

and comprises the following steps which are maintained through the prcduction process:

pumping the molten metal in the mixing chamber to cause turbulent flow therein and thereby cause mixing of the source metals therein;

bleeding a portion of the evaporation bath charge and introducing the bled charge metal into the mixing chamber through a plurality of spaced apart sub-surface bleed passageways which link the evaporation bath with the mixing chamber;

feeding a portion of the mixed metals from the mixing chamber into the evaporation bath through a plurality of spaced apart sub-surface feed passageways which link the mixing chamber with the evaporation bath; and maintaining metal in the mixing chamber by replenishment with molten metal from the feedstock melting chamber.

2. A method as claimed in claim 1 wherein the bleeding is caused by the circulation within the mixing chamber.

3. A method as claimed in claim 2 wherein the feeding is caused by the circulation within the mixing chamber.

4. A method as claimed in claim 1 wherein a bleed rate is established which is 10–20 times the rate of evaporation from the evaporation bath.

5. A method as claimed in claim 3 wherein a bleed rate is established which is 10–20 times the rate of evaporation from the evaporation bath.

6. A method as claimed in claim 4 wherein a flow rate is established in the mixing chamber which is at least 70 times the evaporation rate.

7. A method as claimed in claim 5 wherein a flow rate is established in the mixing chamber which is at least 70 times the evaporation rate.

8. An apparatus for the replenishment of charge material within an evaporation bath wherein the apparatus comprises:

i. an evaporation bath;

ii. a mixing chamber consisting of a passageway encompassing the evaporation bath;

iii passageways linking the interior of the evaporation bath to the mixing chamber the passageways forming two groups each group comprising a plurality of such passageways issuing from the evaporation bath at spaced-apart sub-surface locations therein;

iv. pump means operable to cause turbulent flow of liquid metal along the mixing chamber passageway;

v. bleed means operable to cause withdrawal of liquid metal from the evaporation bath through the passageways of one of the aforementioned groups; and vi. feed means operable to cause introduction of liquid metal to the evaporation bath through the passageways of the remaining group.

9. An apparatus as claimed in claim 8 wherein the bleed means comprises a divergent section of the mixing chamber passageway such that the withdrawal of liquid metal from the evaporation bath is produced by a decrease in hydrodynamic pressure in the mixing chamber contents consequent upon the flow through the divergent section.

10. An apparatus as claimed in claim 9 wherein the feed means comprises a convergent section of the mixing chamber passageway such that the introduction of liquid metal into the evaporation bath is produced by an increase in the hydrodynamic pressure in the mixing chamber contents consequent upon the flow through the convergent section.

11. An apparatus as claimed in claim 10 wherein the pump means comprises an electromagnetic pump.

12. An apparatus as claimed in claim 10 comprising a feed stock melting chamber, means to melt metal therein, and a sub-surface passageway linking the melting chamber to the mixing chamber.

13. An apparatus as claimed in claim 10 wherein the divergent section has an increase in cross section in the range 7–30%.

14. An apparatus as claimed in claim 13 wherein the convergent section has a decrease in cross section in the range 7–30%.

* * * * *